(12) United States Patent
Uchida et al.

(10) Patent No.: US 7,998,781 B2
(45) Date of Patent: Aug. 16, 2011

(54) METHOD OF MANUFACTURING SEMICONDUCTOR DEVICE IN WHICH FUNCTIONAL PORTION OF ELEMENT IS EXPOSED

(75) Inventors: Kenji Uchida, Kawasaki (JP); Koki Hirasawa, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 74 days.

(21) Appl. No.: 12/540,878

(22) Filed: Aug. 13, 2009

(65) Prior Publication Data

US 2010/0055833 A1    Mar. 4, 2010

(30) Foreign Application Priority Data

Sep. 2, 2008  (JP) ................................. 2008-224284

(51) Int. Cl.
*H01L 21/00* (2006.01)
(52) U.S. Cl. ................ 438/66; 438/57; 438/64; 438/65; 438/67; 438/68; 438/69; 438/116; 438/125; 438/126; 438/127
(58) Field of Classification Search ............. 438/57, 438/64–69, 116, 125–127
See application file for complete search history.

(56) References Cited

U.S. PATENT DOCUMENTS

| | | | | |
|---|---|---|---|---|
| 5,622,873 A * | 4/1997 | Kim et al. | ........................ | 438/65 |
| 7,183,589 B2 * | 2/2007 | Kameyama et al. | .......... | 257/100 |
| 7,595,540 B2 * | 9/2009 | Fukuda et al. | ................. | 257/431 |
| 2008/0224333 A1 * | 9/2008 | Fukasawa | ........................ | 257/787 |
| 2009/0022949 A1 * | 1/2009 | Horita et al. | ................... | 428/138 |
| 2009/0086449 A1 * | 4/2009 | Minamio et al. | ............... | 361/760 |
| 2009/0315164 A1 * | 12/2009 | Chow et al. | .................... | 257/680 |

FOREIGN PATENT DOCUMENTS

| | | | |
|---|---|---|---|
| JP | 2003-332542 A | | 11/2003 |
| JP | 2006-237051 A | | 9/2006 |

* cited by examiner

*Primary Examiner* — Kevin M Picardat
*Assistant Examiner* — Bac H Au
(74) *Attorney, Agent, or Firm* — Sughrue Mion, PLLC

(57) ABSTRACT

A method of manufacturing a semiconductor device includes: forming a first resin layer on a wafer having a light receiving portion; patterning the first resin layer into a predetermined shape and forming a first resin film on the light receiving portion; dividing the wafer into light receiving elements; mounting the light receiving elements on an upper surface of a lead frame; a sealing step of forming a sealing resin layer around the first resin film; and removing the first resin film such that a portion of the light receiving element is exposed to the outside, and in the sealing step, the upper surface of the first resin film is flush with the upper surface of the sealing resin layer, or the upper surface of the first resin film is higher than the upper surface of the sealing resin layer.

14 Claims, 8 Drawing Sheets

FIG. 1A
FIG. 1B
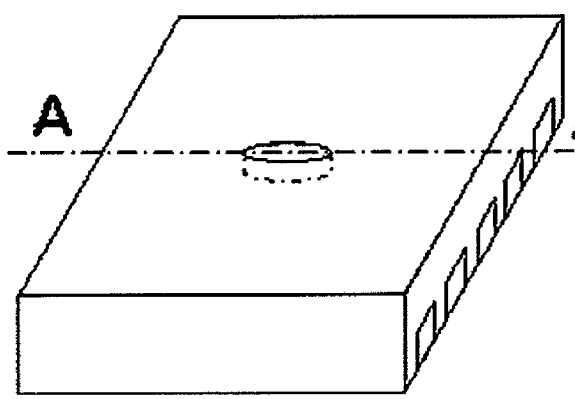
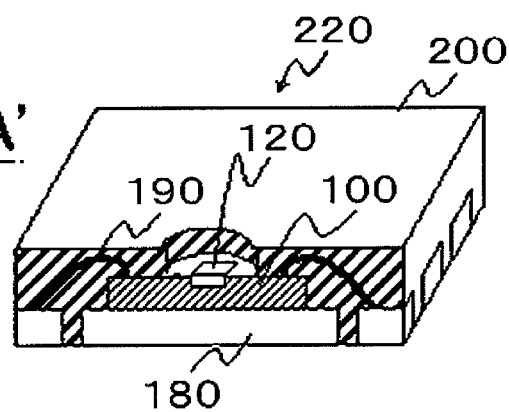

230
240

200

METHOD OF MANUFACTURING SEMICONDUCTOR DEVICE IN WHICH FUNCTIONAL PORTION OF ELEMENT IS EXPOSED

This application is based on Japanese patent application No. 2008-224284, the content of which is incorporated hereinto by reference.

BACKGROUND

1. Technical Field

The present invention relates to a method of manufacturing a semiconductor device in which a functional portion of an element is exposed.

2. Related Art

In recent years, with the development of technology, a semiconductor device in which a functional portion of an element is exposed has come into practical use. In a semiconductor device in which an optical signal is directly input from the outside of the semiconductor device to a light receiving portion of an optical element that converts the optical signal into an electric signal, there is a demand for a structure capable of preventing the attenuation of the optical signal, improving the humidity resistance of the semiconductor device by using a black resin, and obtaining appropriate reflow conditions during lead-free mounting.

In particular, in an optical recording technique using blue light as an optical signal, an epoxy resin used for a light receiving device that converts an optical signal into an electric signal is deteriorated by blue light and the light transmission characteristics of the epoxy resin with respect to the blue light are lowered. As a result, the light receiving device is not available. Therefore, a semiconductor device is required in which an epoxy resin is removed from an optical path to expose the functional portion.

It is expected that the semiconductor device having the above-mentioned structure will be applied to a MEMS (micro electro-mechanical system), an apparatus in which a movable portion is provided in a functional element, such as an electromechanical acoustic filter, and the movable portion is not sealed with a resin, and a solid-state imaging element for a camera.

FIGS. 7A to 7F are cross-sectional views illustrating a method of manufacturing an imaging semiconductor device in which an epoxy resin is removed from an optical path to expose a functional portion, which is disclosed in Japanese Patent Application Laid-Open (JP-A) No. 2006-237051. FIGS. 8A to 8G are cross-sectional views illustrating a method of manufacturing an imaging semiconductor device in which an epoxy resin is removed from an optical path to expose a functional portion, which is disclosed in JP-A No. 2003-332542.

In JP-A No. 2006-237051, as shown in FIG. 7A, a photoresist is applied onto functional portions of a semiconductor wafer 1 having a plurality of semiconductor elements 5 provided thereon, and exposure, development, and etching are performed on the resist to form a resist protective film 2. Then, dicing is performed to obtain the semiconductor elements 5. Then, as shown in FIGS. 7B and 7C, the semiconductor elements 5 each having the resist protective film 2 formed thereon are mounted on a circuit board 6, and the semiconductor elements 5 and the circuit board 6 are electrically connected to each other by wires 7. Then, as shown in FIG. 7D, resin sealing is performed to cover the semiconductor elements 5, the wires 7, and the protective film 2 with a resin 8. The upper surface of the protective film 2 is also covered with the resin 8.

Then, as shown in FIG. 7E, the resin is polished to expose the protective film 2. The exposed protective film 2 is removed by etching to expose the functional portions of the semiconductor elements 5.

Then, as shown in FIG. 7F, a cover glass (cover tape) 11 is provided in order to protect the functional portions, and the semiconductor elements are individually cut. In this way, an imaging semiconductor device is completed.

In JP-A No. 2003-332542, as shown in FIG. 8A, solid-state imaging elements 10 are individually bonded to a base 30 at desired positions. Then, as shown in FIG. 8B, flexible protective films 36 are individually formed to cover light receiving regions of the exposed surfaces of the solid-state imaging elements 10.

Then, as shown in FIG. 8C, the base 30 is electrically connected to the solid-state imaging elements 10 by metal wires 40. Then, as shown in FIG. 8D, a mold having a flat pressing surface is used to press the solid-state imaging elements 10 having the protective films 36 formed thereon together with the base 30 to fill a gap portion surrounded by the pressing surface of the mold, the protective films 36, and adjacent solid-state imaging elements 10 with a sealing material 42.

Then, as shown in FIG. 8E, after the resin molding, the protective film 36 is removed. Then, as shown in FIG. 8F, a light transmitting plate 46 is adhered to the entire surface of the base 30, with the sealing material 42 interposed therebetween, so as to cover the exposed light receiving surface of each of the solid-state imaging elements 10. Then, the adjacent solid-state imaging elements 10 are cut along a cut line therebetween to obtain individual semiconductor devices.

However, when the method disclosed in JP-A No. 2006-237051 is used, some problems arise.

The following problems are all caused by a process of polishing the resin 8 covering the upper surface of the protective film 2 before the resist protective film 2 is removed. The upper surface of the protective film 2 needs to be covered with the resin 8 for the following reason. When the protective film 2 is made of a photoresist with a thickness of 0.1 mm or more by a coating method, there is a variation in the thickness of the film, and it is difficult to uniformly clamp the protective film 2 with the sealing mold during resin sealing. Therefore, it is necessary to cover the upper surface of the protective film 2 with the resin 8. The problems will be described below.

The first problem is that a process of polishing the resin 8 is needed, which results in a reduction in productivity.

The addition of the polish process causes an increase in the number of manufacturing processes and an increase in manufacturing time. In particular, the polish process requires a preparation process of mounting a semiconductor device to be polished to a supporting member, and a post-process of taking off the polished thin semiconductor device from the supporting member. Therefore, processes other than the polish process are added. As a result, the manufacturing time is greatly affected by the addition of the processes.

The second problem is that the quality of the semiconductor device deteriorates.

When the resin 8 is polished by the above-mentioned resin polishing process, the wiring lines are cut or, in worse cases, the semiconductor elements are damaged due to vibration caused by the polishing process. As a result, the quality of the semiconductor device deteriorates.

In the method disclosed in JP-A No. 2003-332542, manufacturing costs increase for the following reason.

In JP-A No. 2003-332542, the protective films 36 are individually adhered to the solid-state imaging elements 10. The individual protective films 36 have flexibility, and the solid-state imaging elements 10 are accurately mounted to the base 30 at desired positions in advance.

Therefore, the protective films 36 need to be individually adhered to the solid-state imaging elements mounted on the base with high accuracy.

In order to accurately adhere the individual flexible protective films 36 to the light receiving regions of the solid-state imaging elements 10 mounted on the base 30, for example, it is necessary to use a camera to detect the positions of both the protective films 36 and the solid-state imaging elements 10 and individually control them to perform adhesion therebetween. That is, expensive facilities are used to adhere the protective films 36, and it is necessary to detect the positions of the protective films and the solid-state imaging elements in order to perform adhesion therebetween. Therefore, a certain amount of time is required for the adhesion, and a manufacturing TAT increases.

As described above, In JP-A No. 2003-332542, expensive facilities and time are required for the process of adhering the protective film. Therefore, it is easily expected that productivity will be lowered and manufacturing costs will increase. When the facilities are not provided and the time for adhesion is not sufficient, the position accuracy of the protective film 36 is lowered, and yield is lowered. As a result, manufacturing costs increase.

In addition, the protective films 36 are individually supplied in advance. Therefore, the cost of the protective film increases.

SUMMARY

In the present invention, there is provided a method of manufacturing a semiconductor device including: forming a first resin layer on a wafer having a functional portion provided therein; patterning the first resin layer into a predetermined shape and forming the first resin portion on the functional portion or around the functional portion; dividing the wafer into elements; of mounting the element on an upper surface of a base; a sealing step of bringing a molding surface of a sealing mold into pressure contact with an upper surface of the first resin portion and a lower surface of the base, and injecting a second resin into a gap portion around the first resin portion among gap portions surrounded by the molding surface of the sealing mold to form a second resin layer around the first resin portion; and removing the first resin portion to expose a portion of the element to the outside. In the sealing step, the upper surface of the first resin portion is flush with the upper surface of the second resin layer, or the upper surface of the first resin portion is higher than that of the second resin layer.

Before the elements are mounted on the upper surface of the base, the first resin layer of the wafer having the functional portions formed thereon is patterned. Therefore, it is possible to collectively form the first resin portions on the functional portions or around the functional portions.

In the sealing step for forming the second resin layer, the molding surface of the sealing mold comes into pressure contact with the upper surface of the first resin portion and the lower surface of the base, and the second resin is injected into the gap portion around the first resin portion among the gap portions surrounded by the molding surface of the sealing mold to form the second resin layer around the first resin portion. Therefore, a process of polishing the first resin portion is not needed.

According to the above-mentioned aspect of the invention, it is possible to provide a method of manufacturing a semiconductor device capable of reducing waste and improving the reliability and productivity of the semiconductor device.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 1A is a perspective view illustrating a semiconductor device according to a first embodiment of the invention;

FIG. 1B is a cross-sectional view illustrating the semiconductor device according to the first embodiment of the invention;

DETAILED DESCRIPTION

Figure 2A:
FIGS. 2A to 2E are process drawings illustrating a method of manufacturing the semiconductor device according to the first embodiment of the invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

FIRST EMBODIMENT

Hereinafter, exemplary embodiments of the invention will be described in detail with reference to the accompanying drawings. In the drawings, the same components are denoted by the same reference numerals and a repeated description thereof will not be repeated. A method of manufacturing a semiconductor device according to a first embodiment of the invention will be described with reference to FIGS. 2A to 4C.

A method of manufacturing a semiconductor device 220 according to the first embodiment includes: forming a first resin layer 130 on a wafer 110 having a functional portion (light receiving portion 120) provided thereon; patterning the first resin layer 130 into a predetermined shape and forming a first resin portion (first resin film 140) on the light receiving portion 120 or around the light receiving portion 120; dividing the wafer 110 into elements (light receiving elements 100); mounting the light receiving elements 100 on an upper surface of a base (lead frame 180) a sealing step of bringing a molding surface of a sealing mold into pressure contact with the upper surface of the first resin film 140 and the lower surface of the lead frame 180 and injecting a second resin (sealing resin) into a gap portion around the first resin film 140 among the gap portions surrounded by the molding surface of the sealing mold to form a second resin layer (sealing resin layer 200) around the first resin film 140; and removing the first resin film 140 such that a portion of the light receiving element 100 is exposed to the outside. In the sealing step, the upper surface of the first resin film 140 is flush with the upper surface of the sealing resin layer 200, or the upper surface of the first resin film 140 is higher than the upper surface of the sealing resin layer 200.

When the first resin layer 130 is made using filmy resin, in the method of manufacturing the semiconductor device 220 according to the first embodiment, the forming the first resin film 140 may include a step of forming the first resin layer 130 as a film on the wafer 110 and a step of patterning the film-shaped first resin layer 130 into a predetermined shape and forming the first resin film 140 on the light receiving portion 120 or around the light receiving portion 120.

[Step 1] Formation of First Resin Film on Light Receiving Portion of Light Receiving Element First, as shown in FIG. 2A, a wafer 110 having a plurality of light receiving elements formed thereon is prepared. The light receiving portion 120 is exposed from the surface of each of the light receiving elements arranged on the wafer 110. A single light receiving element or a plurality of light receiving elements may be arranged on the wafer 110. FIG. 2A shows two of the plurality of light receiving elements arranged on the wafer 110.

Figure 2B:
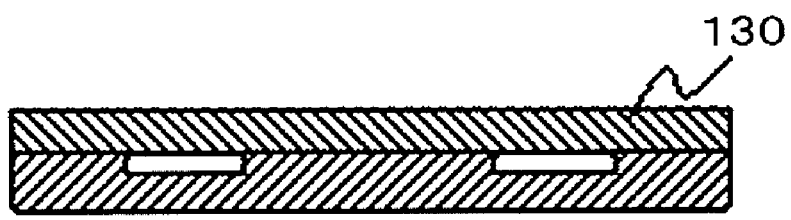

Then, as shown in FIG. 2B, the first resin layer 130 is formed on the wafer 110. It is preferable that the first resin layer 130 be a film having a uniform thickness.

For example, it is possible to form the first resin layer 130 having a uniform thickness of equal to or greater than 0.05 mm on the wafer 110.

In addition, a single first resin layer 130 or a plurality of first resin layers 130 may be made of a first resin with a substantially uniform thickness on the wafer 110. The shape of the first resin layer 130 is not particularly limited.

When the first resin layer 130 is made of a liquid resin, a low-viscosity resin is used in order to form a film with a uniform thickness on the entire surface of the wafer 110. In this case, since the viscosity of the resin is low, it is difficult to obtain a thickness of equal to or greater than 0.05 mm.

On the other hand, a high-viscosity liquid resin is used in order to form a film with a thickness of equal to or greater than 0.05 mm on the entire surface of the wafer 110. Since the high-viscosity liquid resin is coated on the wafer, viscosity resistance is increased, and a variation in height is increased. As a result, it is difficult to obtain a uniform film.

Therefore, when the film forming process ends, the thickness of the first resin layer 130 is measured, and it is preferable to use the film-shaped first resin layer 130 having a guaranteed thickness. In this way, it is possible to obtain a uniform first resin layer 130 having a thickness of equal to or greater than 0.05 mm.

The film used as the first resin layer 130 may be obtained by coating a liquid first resin and drying it.

In this embodiment, the first resin layer 130 covers the entire surface of the wafer 110. It is preferable that the thickness of the first resin layer 130 be equal to or greater than 0.1 mm. In addition, it is preferable that the thickness of the first resin layer 130 be equal to or less than 0.15 mm.

A film having a thickness of 0.12 mm is used to obtain the first resin layer 130 having a thickness of 0.12 mm.

Figure 2C:
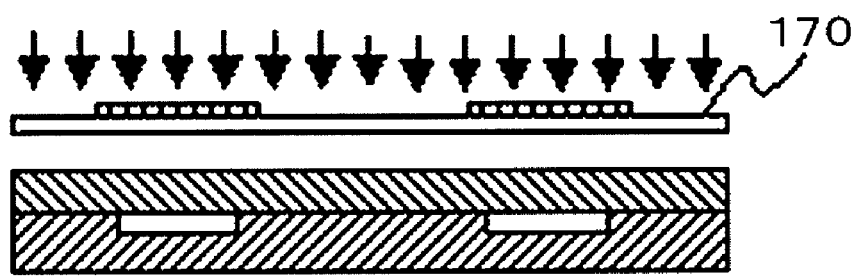

Then, as shown in FIG. 2C, positioning is performed such that the light receiving portions 120 are aligned with predetermined positions on the upper surface of a mask 170 for exposure, and exposure is performed to pattern the first resin layer 130 such that the first resin film 140 is formed.

Figure 2D:
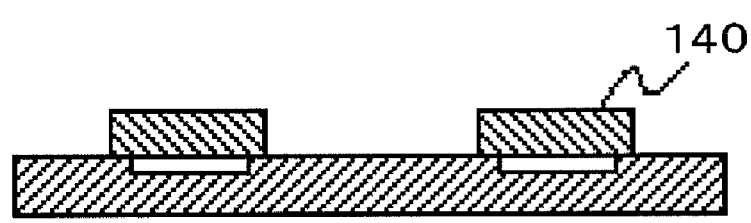

Then, as shown in FIG. 2D, a developing process is performed to remove the first resin layer 130 other than the first resin films 140, thereby forming the first resin films 140 covering the light receiving portions 120.

The first resin film 140 may be formed on the light receiving portion 120 or around the light receiving portion 120. In addition, the first resin film 140 may be formed so as to cover at least the entire light receiving portion 120.

As such, the first resin film 140 may be formed by a photolithography method. However, the first resin film 140 may be formed by other methods. For example, the following light-curable resin may be used as the first resin used for the photolithography method. In the photolithography method, the aperture ratio of the mask, the amount of exposure, the concentration of a developer, the temperature of the developer, or a development time may be appropriately adjusted.

Immediately after the developing process is performed, the first resin films 140 are not completely cured. Therefore, it is considered that the adhesion between the first resin films 140 and the wafer 110, that is, the adhesion between the first resin films 140 and the light receiving elements 100 is not high. That is, it is considered that the adhesion therebetween is low.

Then, a heat treatment is performed on the wafer 110 having the first resin films 140 formed thereon to completely cure the first resin films 140, thereby achieving strong adhesion between the first resin films 140 and the wafer 110, that is, between the first resin films 140 and the light receiving elements 100.

It is preferable that the upper limit of the elastic modulus of the cured first resin be equal to or less than 6 GPa at a temperature of 20° C and equal to or less than 3 GPa at a temperature of 200° C. In addition, it is preferable that the lower limit thereof be equal to or greater than 1 GPa at a temperature of 20° C and equal to or greater than 10 MPa at a temperature of 200° C. In this embodiment, the elastic modulus of the first resin used for the first resin layer 130 is adjusted to about 2.4 GPa at a room temperature and about 15 MPa at a temperature of 200° C.

The elastic modulus is evaluated and obtained by a dynamic viscoelastic measurement method.

The elastic modulus of the first resin can be appropriately adjusted by appropriately changing the kind of resin that is curable by light, heat, and a combination of light and heat or the relative proportions of a material contained in the first resin, such as a hardener, or appropriately setting manufacturing conditions, such as the amount of light for curing and a curing temperature. Examples of the resin that is curable by light, heat, and a combination of light and heat include a light-curable resin, a thermosetting resin, and a photothermosetting resin. In this embodiment, the first resin may include the above-mentioned resins. The light-curable resin may be cured by photochemical reaction, and visible light or an ultraviolet ray may be used as light for curing the resin. In addition, the photothermosetting resin may be a mixture of the thermosetting resin and the light-curable resin.

Detailed examples of the resin include a light-curable resin, such as an acryl-based resin, a thermosetting resin, such as an epoxy resin, and photothermosetting resins, such as an acryl-based resin and an epoxy resin.

Figure 2E:
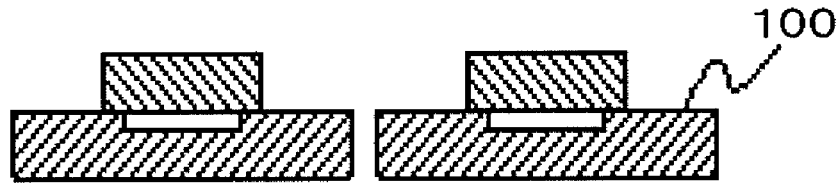

Then, as shown in FIG. 2E, the wafer 110 is divided into the light receiving elements 100. That is, the wafer 110 is cut into the individual light receiving elements 100. In this way, the light receiving element 100 in which the first resin film 140 is provided on the light receiving portion 120 or around the light receiving portion 120 is obtained.

As shown in FIGS. 1A and 1B, the first resin film 140 is formed in a cylindrical shape. In this embodiment, the shape of the first resin film 140 is not limited to the cylinder, but it may be an elliptic cylinder or a quadrangular prism according to the shape of the light receiving portion 120.

Figure 3A:
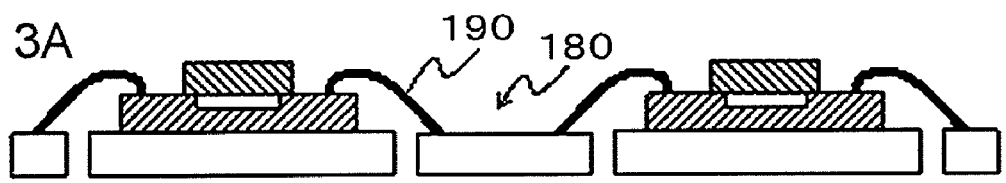
FIGS. 3A to 3D are process drawings illustrating the method of manufacturing the semiconductor device according to the first embodiment of the invention.

[Step 2] Mounting of Divided Light Receiving Elements on Lead Frame and Wire Bonding As shown in FIG. 3A, the light receiving elements 100 are adhered to a lead frame 180 at predetermined positions by an adhesive. Then, predetermined portions of the light receiving elements 100 and the lead frame 180 are electrically connected to each other by thin metal wires 190. The light receiving elements 100 are densely arranged on the lead frame 180 with a predetermined distance therebetween.

[Step 3] Formation of Sealing Resin Layer by Resin Sealing

Figure 3B:
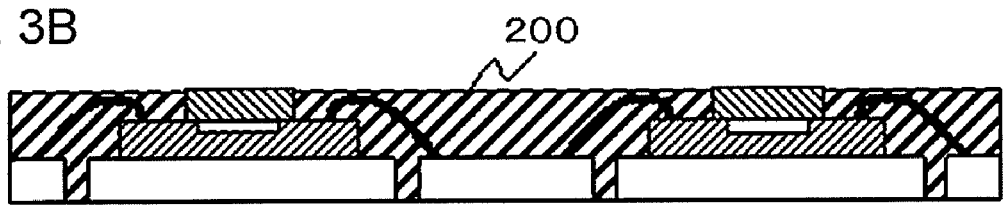

As shown in FIG. 3B, a second resin is applied around the first resin film 140 to cover all of the light receiving elements 100, the thin metal wires 190, and the lead frame 180, thereby forming a sealing resin layer 200. The second resin used for the sealing resin layer 200 may include, for example, glass fillers. Hereinafter, the sealing step will be described in detail with reference to FIGS. 3A to 3D and FIGS. 4A to 4C.

Figure 4A:
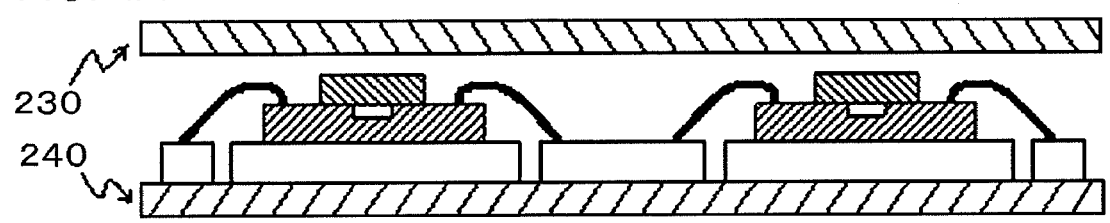
FIGS. 4A to 4C illustrate a sealing step of the method of manufacturing the semiconductor device according to the first embodiment of the invention.

As shown in FIG. 4A, a sealing mold including upper mold 230 and lower mold 240, each having a flat surface as a molding surface, is prepared. The light receiving elements 100 on the lead frame 180 shown in FIG. 3A are fixed at predetermined positions between the sealing molds 230 and 240.

Figure 4B:
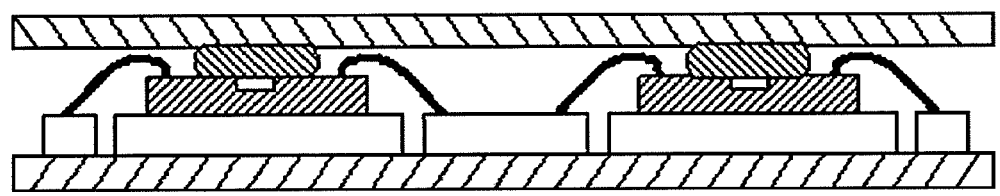

Then, as shown in FIG. 4B, the molding surface of the upper mold 230 of the sealing mold comes into pressure contact with the upper surfaces of the first resin films 140, and the molding surface of the lower mold 240 of the sealing mold comes into pressure contact with the lower surface of the lead frame 180. That is, the molding surface of the upper mold 230 of the sealing mold comes into close contact with the upper surfaces of the first resin films 140 with a minimum gap therebetween, and the molding surface of the lower mold 240 of the sealing mold comes into close contact with the lower surface of the lead frame 180 with a minimum gap therebetween.

In addition, the molding surface of the lower mold 240 of the sealing mold may come into pressure contact with the lower surface of the lead frame 180 with a film interposed therebetween.

Figure 4C:
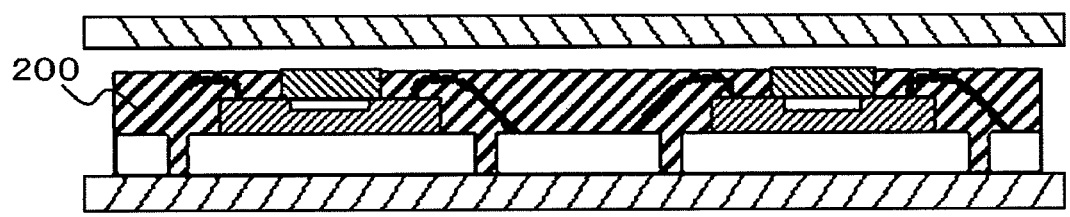

Then, as shown in FIG. 4C, the second resin (sealing resin) melted by heat is injected into a gap portion surrounded by the molding surfaces of the sealing molds 230 and 240 while maintaining the pressure contact state, thereby forming the sealing resin layer 200 filling around the first resin film 140.

At that time, the molding surface of the upper mold 230 of the sealing mold is strongly adhered to the upper surfaces of the first resin films 140 by an external pressing force, and the light receiving elements 100 are strongly adhered to the first resin films 140, as described above.

It is preferable that the elastic modulus of the first resin film 140 be equal to or less than 6 GPa at a temperature of 20° C and equal to or less than 3 GPa at a temperature of 200° C. In addition, it is preferable that the elastic modulus of the first resin film 140 be equal to or greater than 1 GPa at a temperature of 20° C and equal to or greater than 10 MPa at a temperature of 200° C. In this case, the first resin film 140 is elastically deformed by the pressing force of the upper mold 230 of the sealing mold and absorbs the external pressing force to protect the light receiving element 100.

In addition, a reaction force can be generated by the elastic deformation to adhere the first resin film 140 onto the upper mold 230 of the sealing mold. In this way, it is possible to prevent a sealing resin from flowing into the adhesive surface between the first resin films 140 and the upper mold 230 of the sealing mold.

The elastic deformation of the first resin films 140 increases the adhesion between the first resin films 140 and the upper mold 230 of the sealing mold. Therefore, it is possible to increase the height of the upper surface of the first resin film 140 to be larger than that of the upper surface of the sealing resin layer 200 in the range of equal to or greater than 0 mm and equal to or less than 0.05 mm.

If the upper surface of the first resin film 140 is 0.05 mm or more higher than the upper surface of the sealing resin layer 200, the external pressing force of the sealing mold 230 is increased and the first resin film 140 is plastically deformed. As a result, the first resin film 140 is likely to be broken. On the other hand, if the upper surface of the first resin film 140 is lower than the upper surface of the sealing resin layer 200, that is, if the height of the upper surface of the first resin film 140 is less than that of the upper surface of the sealing resin layer 200, it is apparent that the sealing resin flows into the surfaces of the first resin films 140, that is, the adhesive surface between the first resin films 140 and the upper mold 230 of the sealing mold.

Then, the sealing molds 230 and 240 are removed and the light receiving elements 100, each having the first resin film 140 whose upper surface slightly protrudes from the upper surface of the sealing resin layer 200, are obtained as shown in FIG. 3B. In this way, the light receiving elements 100 densely arranged on the lead frame 180 are collectively sealed.

[Step 4] Removal of First Resin Film (Exposure of Light Receiving Portion)

Figure 3C:
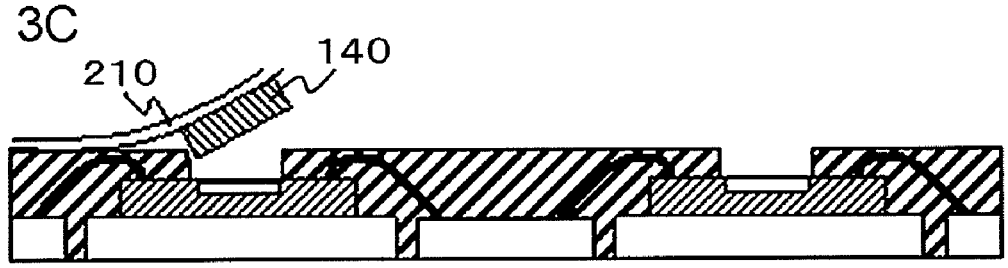

As shown in FIG. 3C, the first resin films 140 are removed to expose the light receiving portions 120. The exposure process makes it possible to allow an optical signal input from the outside to be directly input to the exposed light receiving portion 120, thereby preventing the attenuation of the optical signal.

In addition, a black resin including glass fillers may be used as the sealing resin. In this case, it is possible to improve the humidity resistance of the semiconductor device 220 and obtain appropriate reflow conditions during lead-free mounting.

In particular, in an optical recording technique using blue light as an optical signal, for example, an epoxy resin used for a light receiving device that converts an optical signal into an electric signal is deteriorated by blue light and the light transmission characteristics of the epoxy resin with respect to the blue light are lowered. Therefore, a semiconductor device is required in which an epoxy resin is removed from an optical path to expose a portion of the functional element.

A removal method is not limited to the following method. First, the lead frame 180 on which the first resin film 140 is surrounded by the sealing resin layer 200 is immersed in a remover. The surface of the first resin film 140 is swelled by the remover, and a portion of the surface is dissolved. In this case, the adhesion between the first resin film 140 and the light receiving element 100 and the adhesion between the first resin film 140 and the sealing resin layer 200 are lowered.

Then, the lead frame is taken out from the remover, and an adhesive peeling tape 210 is adhered to the surface of the sealing resin layer 200 in which the first resin film 140 is formed so as to be closely adhered to the first resin film 140, and then peeled off.

As described above, the adhesion between the first resin film 140 and the light receiving element 100 and the adhesion between the first resin film 140 and the sealing resin layer 200 are lowered by the remover. Therefore, it is possible to remove the first resin film 140 using the adhesion force between the peeling tape 210 and the first resin film 140. As a result, it is possible to obtain the light receiving element 100 from which the first resin film 140 is removed, as shown in FIG. 3C.

[Step 5] Division of Lead Frame into Individual Semiconductor Devices

Figure 3D:
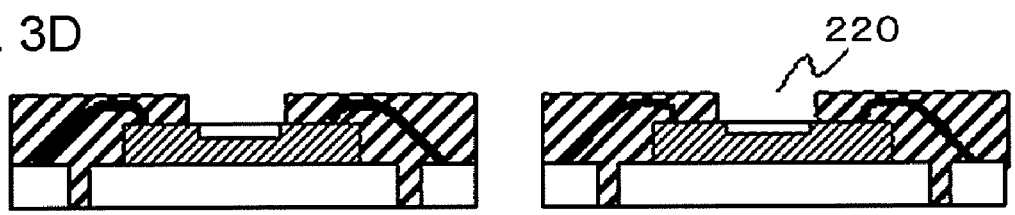

Then, as shown in FIG. 3D, the lead frame 180 is divided into the individual light receiving elements 100, thereby obtaining a semiconductor device 220 having a desired shape.

As shown in FIG. 1B, the semiconductor device 220 includes the light receiving element 100 provided on the upper surface of the lead frame 180 and the sealing resin layer 200 that is made of the second resin and fills around the light receiving portion 120 (functional portion), which is an opening provided in the light receiving element 100. In addition, the light receiving elements 100 are electrically connected to the lead frame 180 by the thin metal wires 190.

Next, the effects of the first embodiment will be described.

FIG. 1A is a perspective view illustrating the semiconductor device according to the first embodiment of the invention. FIG. 1B is a cross-sectional view taken along the line A-A' of FIG. 1.

First, it is possible to improve manufacturing yield. The semiconductor device manufacturing method disclosed in JP-A-2006-237051 requires a process of polishing the resin 8 covering the upper surface of the protective film 2. However, according to this embodiment, the sealing resin is not infiltrated into the upper surface of the first resin film 140, and the polish process is not needed. Therefore, it is possible to reduce the number of manufacturing processes. In addition, the semiconductor device is manufactured without being affected by, for example, vibration caused by polishing. Therefore, it is also possible to improve the reliability of the semiconductor device.

In the semiconductor device manufacturing method disclosed in JP-A-2003-332542, it is necessary to accurately adhere the protective film 36 to the solid-state imaging elements mounted on the individual bases. However, according to this embodiment, the first resin layer 130 is adhered to the entire surface of the wafer 110, and the first resin layer 130 is collectively and accurately formed. Therefore, productivity is increased and the shape and position accuracy of the first resin layer 130 are improved. As a result, a high-quality first resin layer 130 is formed.

Second, it is possible to reduce waste. In the semiconductor device manufacturing method disclosed in JP-A-2006-237051, the resin 8 covering the upper surface of the protective film 2 is polished. Therefore, the polished resin 8 and the waste of a polishing agent are generated. However, according to this embodiment, the sealing resin is not infiltrated into the upper surface of the first resin film 140, and the polishing process is not needed. Therefore, it is possible to reduce waste.

In addition, a film may be interposed between the lower surface of the lead frame 180 and the molding surface of the lower mold 240 of the sealing mold to increase the pressure contact force therebetween.

From the above-mentioned effects, it is possible to provide a semiconductor element for treating light and a method of manufacturing the semiconductor device 220 that does not require a process of polishing a resin forming the semiconductor device 220 and is capable of improving manufacturing yield, reducing waste, and improving the reliability of the semiconductor device 220.

In this embodiment, the thickness of the first resin film 140 is 0.12 mm. However, the thickness of the first resin film 140 can be appropriately adjusted. If the height of the first resin film 140 is equal to or greater than 0.12 mm, the thickness of the first resin layer 130 may be further increased. The thickness of the first resin layer 130 can be adjusted such that the thickness of the sealing resin layer 200 is equal to or less than that of the first resin layer 130 by the sealing step.

The thickness of the first resin film 140 is equal to or greater than 0.1 mm, preferably, equal to or less than 0.15 mm, and the thickness of the sealing resin layer 200 can be appropriately adjusted such that the thin metal wire 190 does not protrude from the sealing resin layer 200.

According to this embodiment, in the forming the first resin film 140 on the light receiving portion 120 of the wafer 110, or around the light receiving portion 120, a resin film is used as the first resin film 140. In this case, it is possible to make the thickness of the thickest portion of the first resin film 140 uniform, in the contact surface of the first resin film 140 with the upper mold 230 of the sealing mold. In this way, the first resin film 140 is formed such that the upper surface of the first resin film 140 is flush with the upper surface of the sealing resin layer 200, or the upper surface of the first resin film 140 is higher than the upper surface of the sealing resin layer 200. Then, the sealing resin layer 200 is sealed with the first resin film 140 being slightly pressed. Therefore, there is no gap between the upper surface of the first resin film 140 and the molding surface of the sealing mold 230, and the infiltration of the sealing resin layer 200 into the upper surface of the first resin film 140 is prevented.

Since the first resin film 140 has elasticity, the first resin film 140 can serve as a buffer for the pressing force of the sealing mold 230 when the upper mold 230 of the sealing mold comes into pressure contact with the upper surfaces of the first resin films 140. In this way, it is possible to reduce the pressing force applied to the light receiving element 100 and prevent the defects of an element, such as cracks.

The first resin films 140 made of the first resin are collectively formed by covering the entire surface of the wafer 110 on which the light receiving portions 120 are formed with the first resin layer 130 and accurately etching it by, for example, a photolithography method.

As described above, in the method of manufacturing the semiconductor device 220 according to this embodiment, the upper surface of the first resin film 140 can be sealed by a resin without the sealing resin layer 200. Therefore, the process of polishing the sealing resin layer 200 according to the related art is not needed. As a result, it is possible to improve productivity and reduce product costs.

The first resin films 140 are formed on the wafer 110 before the wafer 110 is divided into the individual light receiving elements 100. It is possible to collectively and accurately form the first resin films 140 using, for example, the photolithography method. Therefore, it is possible to improve productivity and quality of the semiconductor device.

In addition, the manufacturing method according to this embodiment does not include a polishing process. Therefore, vibration when the semiconductor device 220 is polished does not occur. As a result, it is possible to improve product quality of the semiconductor device.

In addition, waste is not generated due to polishing. Therefore, it is possible to reduce waste and manufacturing costs.

Although the embodiment of the invention has been described above with reference to the drawings, the invention is not limited thereto. Various structures other than the above can be used.

SECOND EMBODIMENT

Figure 5A:
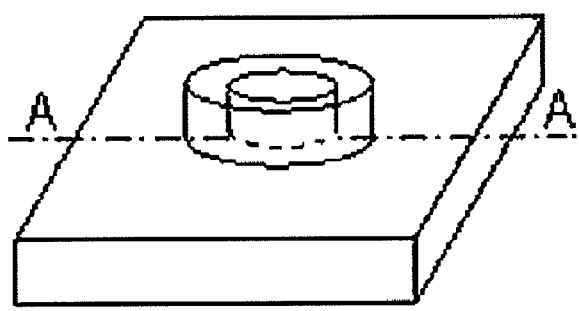
FIG. 5A is a perspective view illustrating a semiconductor device according to a second embodiment of the invention.
Figure 5B:
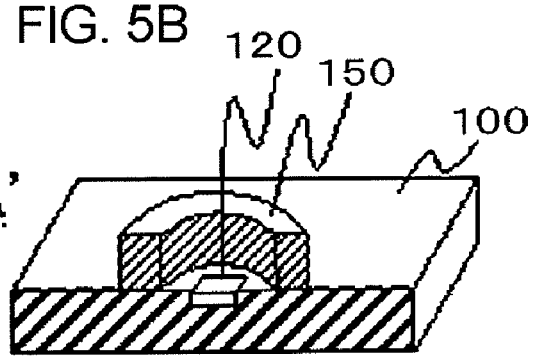
FIG. 5B is a cross-sectional view illustrating the semiconductor device according to the second embodiment of the invention.

FIGS. 5A and 5B are a perspective view and a cross-sectional view illustrating the shape of a first resin portion (frame 150) in a method of manufacturing a semiconductor device according to a second embodiment of the invention, respectively.

In the first embodiment, the first resin film 140 has a cylindrical structure. However, in the second embodiment, the first resin portion (frame 150) has a frame-shaped structure with an opening through which a portion of the surface of the light receiving element 100 is exposed. The other structures of the second embodiment are the same as those of the first embodiment.

The method of manufacturing the semiconductor device 220 according to the second embodiment is the same as that according to the first embodiment and a description thereof will not be repeated.

The experimental results proved that the same effects as those in the first embodiment were obtained by the frame 150.

When the frame 150 is formed in a frame shape, the frame 150 can be peeled off in a process of removing the frame 150 easier than the first resin film 140 according to the first embodiment.

This is because the contact area of the frame 150 having a frame shape with a remover is greater than that of the first resin film 140 according to the first embodiment and the frame 150 can be easily swelled and dissolved.

The frame 150 having a frame shape makes it possible to further improve productivity in the second embodiment of the semiconductor device.

THIRD EMBODIMENT

Figure 6A:
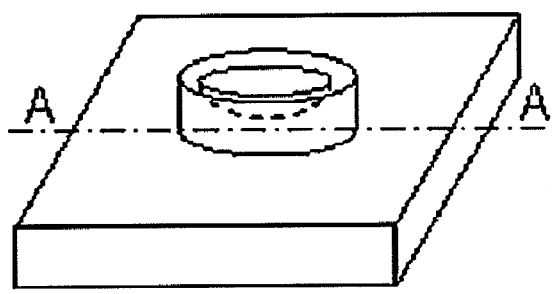
FIG. 6A is a perspective view illustrating a semiconductor device according to a third embodiment of the invention.
Figure 6B:
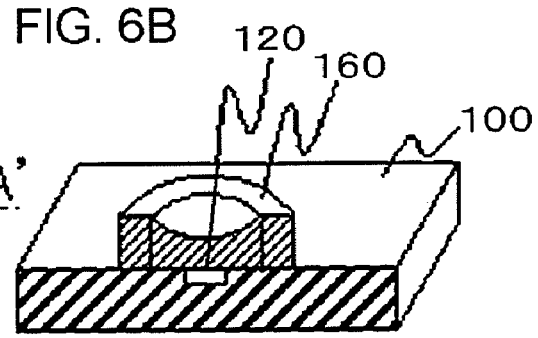
FIG. 6B is a cross-sectional view illustrating the semiconductor device according to the third embodiment of the invention.
Figure 7A:
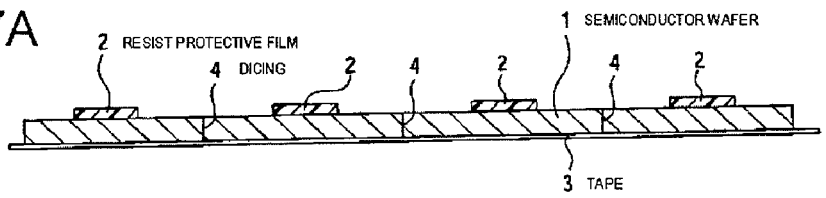
FIGS. 7A to 7F are process drawings illustrating a method of manufacturing a semiconductor device according to the related art (JP-A No. 2006-237051)
Figure 7B:
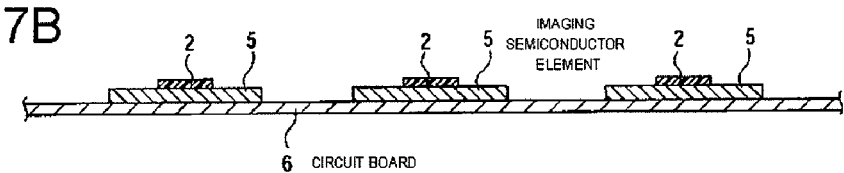
Figure 7C:
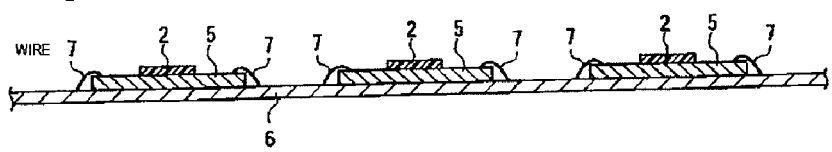
Figure 7D:
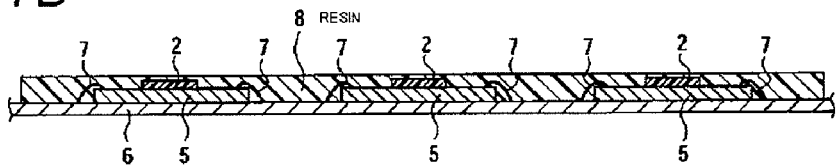
Figure 7E:
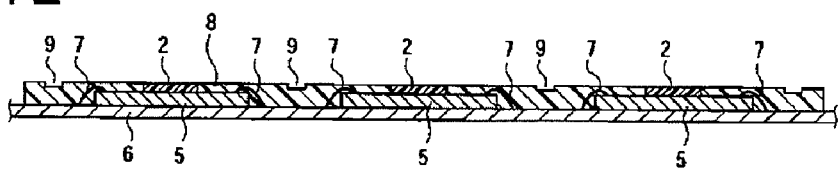
Figure 7F:
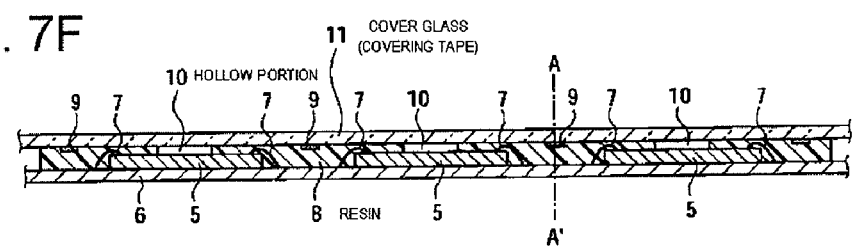
Figure 8A:
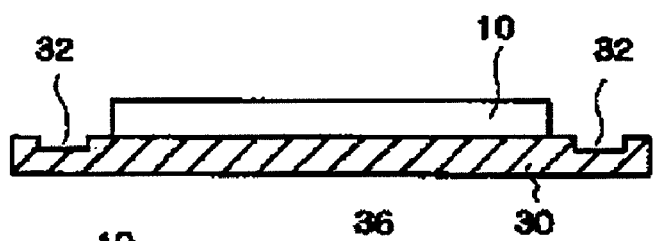
FIGS. 8A to 8G are process drawings illustrating a method of manufacturing a semiconductor device according to the related art (JP-A No. 2003-332542).
Figure 8B:
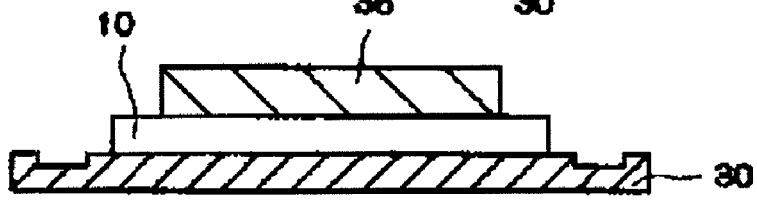
Figure 8C:
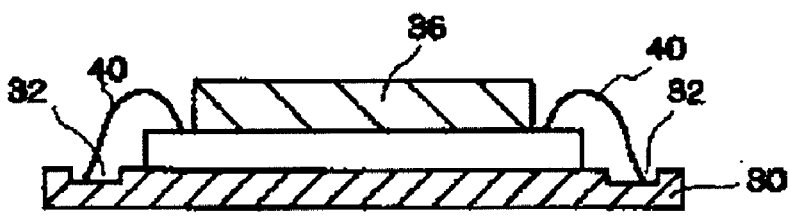
Figure 8D:
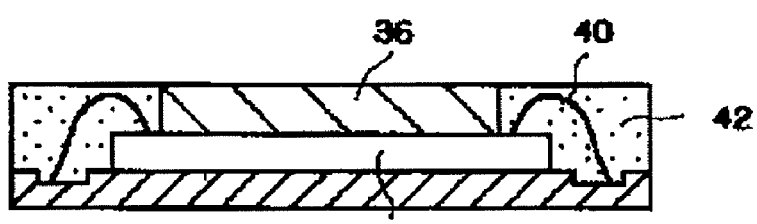
Figure 8E:
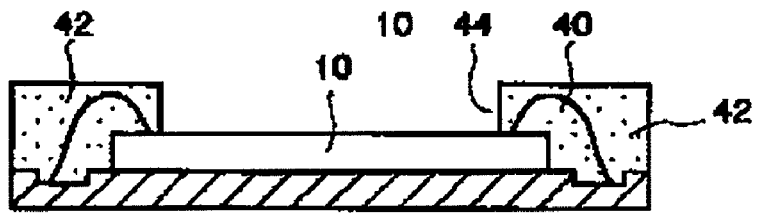
Figure 8F:
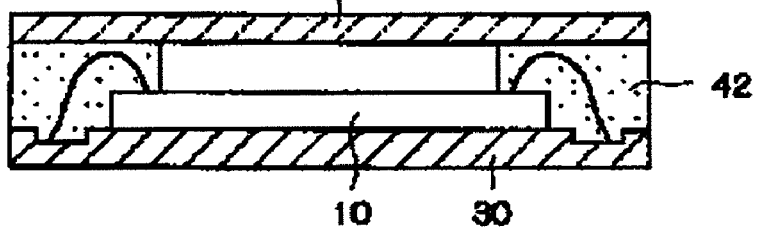
Figure 8G:
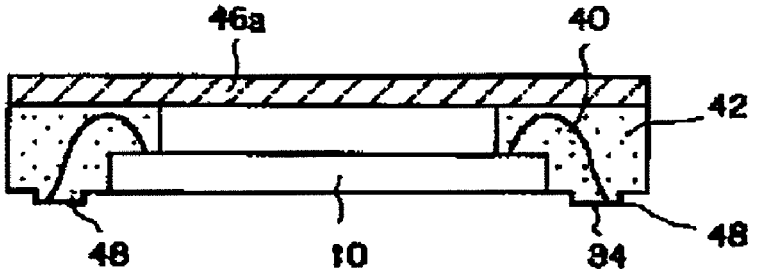

FIGS. 6A and 6B are a perspective view and a cross-sectional view illustrating the shape of a first resin portion (concave member 160) in a method of manufacturing a semiconductor device according to a third embodiment, respectively.

In the first embodiment, the first resin film 140 has a cylindrical structure. However, the third embodiment is characterized in that the thickness of a concave portion of the first resin portion (concave member 160) is partially small. The other structures of the third embodiment are the same as those of the first embodiment.

The method of manufacturing the semiconductor device according to the third embodiment is the same as that according to the first embodiment and a description thereof will not be repeated.

The experimental results proved that the same effects as those in the first embodiment were obtained by the structure of the concave member 160.

Since the thickness of the concave portion of the concave member 160 is partially small, the concave member 160 can be peeled off in a process of removing the concave member 160 easier than the first resin film 140 according to the first embodiment.

This is because the contact area of the concave member 160 having the concave portion with a remover is greater than that of the first resin film 140 according to the first embodiment and the concave member 160 can be easily swelled and dissolved.

Further, this embodiment is more effective for a light receiving element 100 including a smaller light receiving portion 120 than the second embodiment. The reason is as follows. When the first resin layer 130 is processed into the frame 150, the center of the frame 150 should be completely removed during development. However, when the light receiving portion 120 is small, it may be impossible to process the frame 150 due to the limit of processing accuracy.

In the light receiving element 100 including a small light receiving portion 120, when a thin resin film is formed in the concave portion, which is a central portion of the concave member 160, in advance, it is possible to easily remove the concave member 160 substantially similar to the case where the frame 150 is processed.

It is apparent that the present invention is not limited to the above embodiment, and may be modified and changed without departing from the scope and spirit of the invention.

What is claimed is:

1. A method of manufacturing a semiconductor device comprising:
   forming a first resin layer on a wafer having a functional portion provided therein;
   patterning said first resin layer into a predetermined shape and forming a first resin portion on said functional portion or around said functional portion;
   dividing said wafer into elements;
   mounting said elements on an upper surface of a base;
   bringing a molding surface of a sealing mold into pressure contact with an upper surface of said first resin portion and a lower surface of said base, and injecting a second resin into a gap portion around said first resin portion among said gap portions surrounded by said molding surface of said sealing mold to form a second resin layer around said first resin portion; and
   removing said first resin portion to expose a portion of said element to the outside,
   wherein in said step of forming said second resin layer, the upper surface of said first resin portion is flush with the upper surface of said second resin layer, or the upper surface of said first resin portion is higher than that of said second resin layer, and
   wherein the upper surface of said first resin portion is higher than that of said second resin layer in the range of equal to greater than 0 mm and equal to or less than 0.05 mm.

2. The method of manufacturing a semiconductor device according to claim 1, wherein said step of exposing a portion of said element to the outside comprises immersing said first resin portion into a remover to remove said first resin portion using an adhesive tape.

3. The method of manufacturing a semiconductor device according to claim 1, wherein a first resin used for said first resin portion is any one of a light-curable resin, a thermosetting resin, or a photothermosetting resin.

4. The method of manufacturing a semiconductor device according to claim 1, wherein the elastic modulus of a cured first resin used for said first resin portion is equal to or less than 6 GPa at a temperature of 20° C and equal to or less than 3 GPa at a temperature of 200° C.

5. The method of manufacturing a semiconductor device according to claim 1, wherein the elastic modulus of a cure first resin used for said first resin portion is equal to or greater than 1 GPa at a temperature of 20° C and equal to or greater than 10 MPa at a temperature of 200° C.

6. The method of manufacturing a semiconductor device according to claim 1, wherein the thickness of said first resin portion is equal to or greater than 0.1 mm.

7. The method of manufacturing a semiconductor device according to claim 1, wherein the thickness of said first resin portion is equal to or less than 0.15 mm.

8. The method of manufacturing a semiconductor device according to claim 1, wherein said first resin layer is made using low viscosity resin.

9. The method of manufacturing a semiconductor device according to claim 1, wherein said step of forming said first resin portion comprises:
    forming said first resin layer as a film on said wafer; and
    patterning said film-shaped first resin layer into a predetermined shape to form a first resin film on said functional portion or around said functional portion.

10. The method of manufacturing a semiconductor device according to claim 1, further comprising:
    dividing said base into said elements after said step of removing said first resin portion.

11. The method of manufacturing a semiconductor device according to claim 1, wherein in said step of forming said second resin layer, said molding surface of said sealing mold comes into pressure contact with the lower surface of said base with a film interposed therebetween.

12. The method of manufacturing a semiconductor device according to claim 1, wherein said first resin portion is formed so as to cover at least said entire functional portion, or said first resin portion is formed as a frame through which a portion of or the entire functional portion is exposed.

13. The method of manufacturing a semiconductor device according to claim 1, wherein said first resin portion comprises a concave member;
    wherein a first thickness of a concave portion of said concave member is smaller than a second thickness of said concave member.

14. A method of manufacturing a semiconductor device comprising:
    forming a first resin layer on a wafer having a functional portion provided therein;
    patterning said first resin layer into a predetermined shape and forming a first resin portion on said functional portion or around said functional portion;
    dividing said wafer into elements;
    mounting said elements on an upper surface of a base;
    bringing a molding surface of a sealing mold into pressure contact with an upper surface of said first resin portion and a lower surface of said base, and injecting a second resin into a gap portion around said first resin portion among said gap portions surrounded by said molding surface of said sealing mold to form a second resin layer around said first resin portion; and
    removing said first resin portion to expose a portion of said element to the outside,
    wherein in said step of forming said second resin layer, the upper surface of said first resin portion is flush with the upper surface of said second resin layer, or the upper surface of said first resin portion is higher than that of said second resin layer, and
    wherein said step of exposing a portion of said element to the outside comprises immersing said first resin portion into a remover to remove said first resin portion using an adhesive tape.

* * * * *